United States Patent
McDonald

(12) United States Patent (10) Patent No.: US 7,170,915 B2
McDonald (45) Date of Patent: Jan. 30, 2007

(54) ANTI-REFLECTIVE (AR) COATING FOR HIGH INDEX GAIN MEDIA

(75) Inventor: Mark E. McDonald, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 320 days.

(21) Appl. No.: 10/625,950

(22) Filed: Jul. 23, 2003

(65) Prior Publication Data
US 2005/0031010 A1     Feb. 10, 2005

(51) Int. Cl.
*H01S 5/00* (2006.01)
(52) U.S. Cl. ............... 372/49.01; 372/46.014
(58) Field of Classification Search ............ 372/50.01, 372/46.014, 49.01
See application file for complete search history.

(56) References Cited

U.S. PATENT DOCUMENTS

| | | | |
|---|---|---|---|
| 5,274,661 A * | 12/1993 | von Gunten et al. ....... 359/589 |
| 6,340,827 B1 * | 1/2002 | Choi et al. ................... 257/310 |
| 6,347,106 B1 * | 2/2002 | Dijaili et al. ............ 372/46.01 |
| 6,538,298 B1 * | 3/2003 | Weingarten et al. ........ 257/436 |
| 6,826,219 B2 * | 11/2004 | Weingarten et al. ..... 372/49.01 |
| 6,947,218 B2 * | 9/2005 | Turner, III .................. 359/589 |
| 2004/0263983 A1 * | 12/2004 | Acree ......................... 359/586 |

* cited by examiner

*Primary Examiner*—Armando Rodriguez
*Assistant Examiner*—Tuan N. Nguyen
(74) *Attorney, Agent, or Firm*—Kevin A. Reif

(57) ABSTRACT

Anti-reflective coatings may be used on laser high index gain media to mitigate reflection. An absentee layer may be used to compliment the antireflective coating to improve its antireflective performance over a broader range of wavelengths. The absentee layer comprises a material having a higher index of refraction than that of the gain media and has a thickness corresponding to multiple halfwave thicknesses related to the center wavelength output by the laser.

9 Claims, 4 Drawing Sheets

ANTI-REFLECTIVE (AR) COATING FOR HIGH INDEX GAIN MEDIA

FIELD OF THE INVENTION

Embodiments of the present invention relate to optics and, more particularly, to antireflective (AR) coatings for high index gain media.

BACKGROUND INFORMATION

Tunable external-cavity semiconductor diode lasers (ECDL) including frequency selective tuning elements in the cavity are gaining wide spread use in many applications and notably in communications. In addition to lenses, mirrors, filters and various other components, such lasers typically include a semiconductor high gain media having an antireflection (AR) coating on the intracavity facet to reduce its reflectivity. Other components of the laser may also include AR coatings.

Whenever light crosses the boundary between two media some or all of the light may be reflected. The refractive index, traditionally designated "n", is a measure of the amount of impedance a particular material has to the propagation of light. In a vacuum light travels at a rate of $3 \times 10^8$ m/s. When light travels through a different medium, the "impedance" of that medium slows the speed of the light to c/n, where "c" is the speed of light in a vacuum and "n" is the refractive index.

The AR coating operates to match the impedance (or admittance, the reciprocal of impedance) between the gain media and the surrounding media. The surrounding media is typically air having a refractive index of n about equal to 1, very close to that of a vacuum. The amount of light reflected is dependent on several factors including the wavelength of the light, polarization, the reflective indices of the media, and the incident angle of the light itself.

In many applications it is desirable that as much of the incident light as possible be transmitted from the gain media and not reflected away. Unfortunately, the reflection at a boundary between air and a typical gain medium material is about 30% of the incident light. Perhaps more significant for ECDLs, it is desirable that as little light as possible be reflected back into the gain media. This back reflection is generally referred to as feedback and has a destructive interference effect on the laser output. Generally the feedback should be kept less that −40 dB (i.e., less than 0.01%). Depositing an efficient AR coating on the gain media surface can significantly reduce reflection.

As noted above, one of the factors affecting the amount of reflection is the wavelength of the light. So to, the wavelength of the light affects the performance of the AR coating in its ability to mitigate reflection. Tunable lasers are expected to operate over a wide range of frequencies or wavelengths. Thus, the AR coating used should be selected to operate effectively over a wide range. A judicious choice of the material used for the AR coating may lead to significant broadening of the AR performance. However, this often requires the use of somewhat exotic materials to realize the best effect. In general, these materials may not even exist. In practice, an AR coating comprises at least two or more dissimilar materials layered, one on top of the other, in order to improve the overall AR effect. However, this solution typically improves performance over only a narrow range of frequencies and broadband performance of the laser suffers outside this range.

DETAILED DESCRIPTION

In its most basic terms, an AR coating comprises a thin layer of some material that has a refractive index (or admittance) somewhere between that of the high gain media (e.g. InGaAsP) and the adjacent media (e.g. air). Any incident light may be reflected at both the AR/gain-media boundary and at the AR/air boundary. By properly selecting the thickness of the AR-layer a destructive interference between the two reflected waves occur that serves to mitigate reflection at a given wavelength ($\lambda$). Arithmetically speaking, in order to permit elimination of reflection, the refractive index of the applied AR layer should equal the square root of the product of the indexes for air and the gain medium.

Unfortunately, for a given application it may difficult to find a suitable material for the AR layer that meets these criteria. Thus it is often the case that more than one layer, each with a different refractive index, is used on top of one another to approximate the ideal resulting in as close to zero reflected light as possible.

Figure 1:
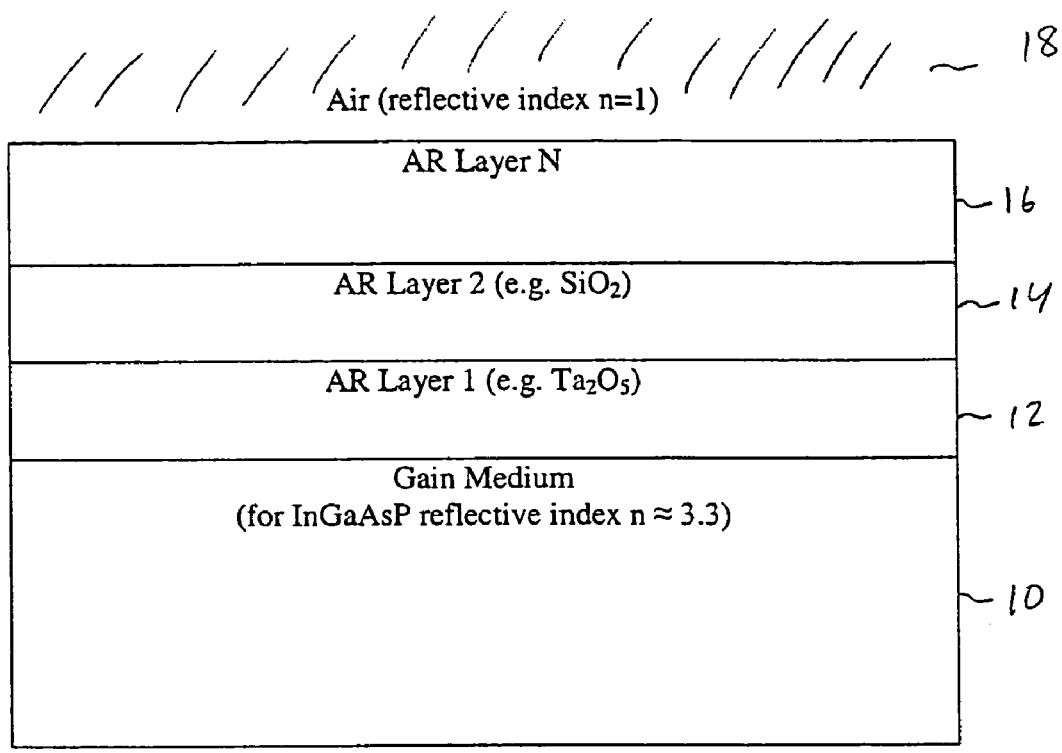
FIG. 1 is a gain medium comprising two or more AR layers to mitigate reflection.

Referring now to FIG. 1, there is shown a semiconductor gain medium having an antireflective (AR) coating. As shown, the gain medium 10 may comprise for example InGaAsP. One or more AR layers are placed on the gain medium 10 in successive layers. Here, two AR layers are shown, AR layer 1 which may be for example $Ta_2O_5$ 12, and AR Layer 2, which may be for example $SiO_2$ 14. Additional layers may also be used in some applications as represented AR layer N 16.

Figure 2:
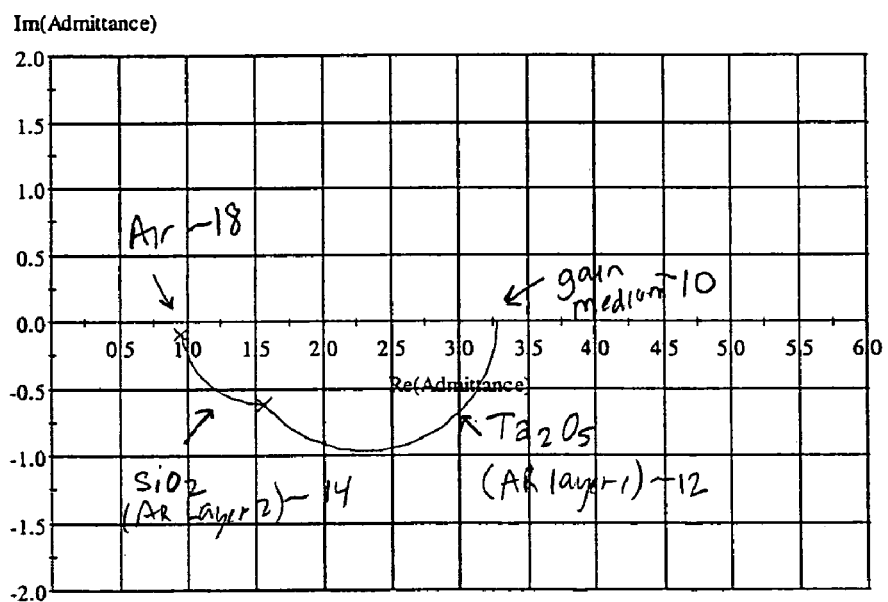
FIG. 2 is an Argand diagram showing admittance matching from the gain medium to air using multiple AR layers as shown in FIG. 1.

The action of an AR layer(s) 12 and 14 can be depicted on an admittance (Argand) diagram as shown in FIG. 2. This is similar in concept to a Smith chart (commonly used in electrical engineering analysis) except that admittance is used rather than impedance, as admittance is conveniently proportional to index of refraction in the optical frequencies. In the Argand diagram the x-axis shows real portion of the admittance values in terms of refractive index and the imaginary axis shows the imaginary component of the admittance value on the complex plane.

The goal of an AR coating is to match the admittance (or match the impedance if you prefer) of the gain medium 10, which in the case of InGaAsP has an admittance of 3.28 (about equal to 3.3), to the immersing air medium 18 of having an admittance of about 1.00. Paths in this diagram accumulate positive phase, shown always as a clockwise path. Any combination of materials and arc lengths that lead in combination from the admittance of the gain medium 10 (n=(3.28, 0)) to the admittance of air (n=(1.00, 0)) on the complex plane is a potentially valid AR coating. The arc lengths of each segment change inversely proportional to the change wavelength output by the gain medium 10. As a result, one generally prefers the thinnest coating (shortest arc lengths), as a unit change in wavelength results in the smallest deviation from perfect anti-reflection. Hence, even thin, but high performance AR coatings suffer an unavoidable deviation from ideal anti-reflection away from the design wavelength.

Stepping through the Argand diagram in a clockwise direction starting with the gain medium 10, the gain medium 10 has a reflective index of about (3.3, 0) on the complex plane and air 18 has a reflective index of about (1.00, 0). The intermittent AR layers operate to match the admittance between the gain medium 10 and the air 18. As shown, the $Ta_2O_5$ of AR layer 1 (12) exhibits an arc spanning admittance between (3.3, 0) and about (1.6, −0.6) on the complex plane. Thus, an additional material should also used. In this case a second layer 14 of $SiO_2$ may be used to span the admittance between about (1.6, −0.6) and (1.00, 0), the refractive index of air 18.

FIG. 2 depicts the effects for a deviation from light having a wavelength of 1545 nm to 1650 nm (note this is much greater range than telecom bands, but needed to depict the effect on this graphical scale). Note that the change in arc lengths associated with the two AR layers 12 and 14 leads to a path terminating at a point other than the admittance of air (free space). That is, the path does not terminate at exactly (1.00, 0). This leads to an unwanted reflection at a gain medium facet that competes with the external cavity reflectance and detracts from stability of the ECDL.

A solution to mitigate this unwanted reflection is to add a half wave layer of some dielectric material having a higher refractive index than the gain medium 10. For example Si may be used for the half wave material since it has a refractive index of about 3.5 (which is greater than the refractive index of 3.3 for InGaAsP). By doing so, there is no change in performance at a given design wavelength (e.g. 1545 nm), as each half wave results in a circular path terminating on the original substrate admittance.

Figure 3:
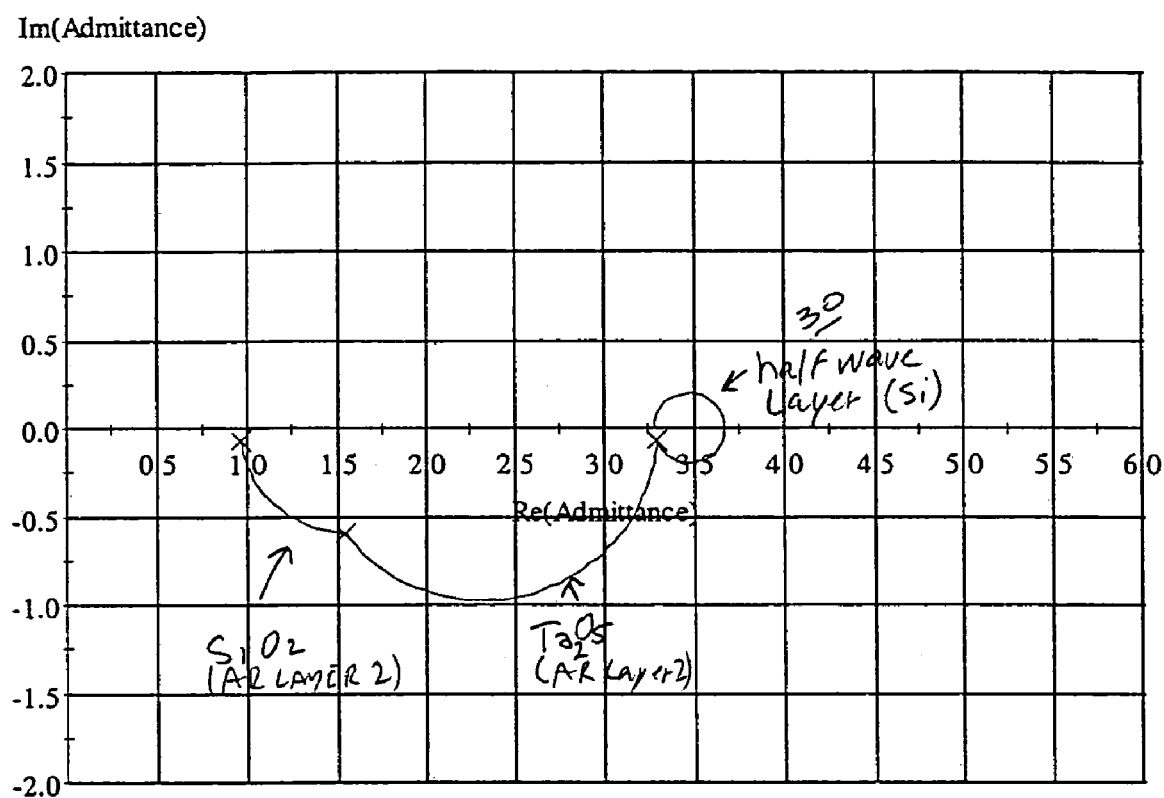
FIG. 3 is an Argand diagram when a broadening layer is added to the AR layer.

The effects of adding a half wave layer of Si between the gain medium 10 and AR Layer 1 (12) is shown in the Argand diagram of FIG. 3. As shown, the half wave layer produces a circular path 30 terminating at the original admittance. Using a half wave layer tends to have a beneficial effect at wavelengths other than the design wavelength. That is, shifts in the endpoint of the half wave layer tend to oppose the effects on the AR coating, leading to a greater AR bandwidth. In other words, the AR coating with the additional half wave layer of Si or some other suitable material tends to mitigate reflections for the target bandwidth as well as for wavelengths immediately adjacent the target bandwidth.

This technique may be referred to as half wave flattening. Note that the beneficial effect of the half wave layer may be relatively small. For less sophisticated optical substrates (e.g., glass), one can optimize the effect of the half wave flattening by increasing the index of the half wave material, thereby increasing the diameter and hence arc length of the nominal circle 30 at the design wavelength. Judicious choice of half wave material may lead to significant broadening of the AR performance; however, this often requires somewhat exotic materials for best effect.

However, AR coating of laser gain media 10 is more challenging than is the case of glass insofar as semiconductor gain media typically have a very high admittance. As the dielectric half wave layer should have a refractive index higher than that of the substrate to be AR coated, there are very few choices of suitable materials. As a result, the addition of a half wave layer results in relatively little broadening of the AR performance. Modern coating technology permits longer/thicker depositions than had been available heretofore. Hence, an alternate half wave flattening design approach is possible. The arc length of the flattening layer can be increased not by choice of material per se, but rather by number of "windings". Windings as used here refer to the thickness of the half-wave layer where each addition of a half wave thickness results in an additional winding or loop around the circle 30. In this way, the compensating effect of the half wave or "absentee" layer can be tailored for a given material, leading to significant improvement in AR bandwidth This approach permits a choice of a non-exotic material (e.g. Silicon), available in most coating machines (since it may already be used to make $SiO_2$). Additionally, the nature of the absentee layer being close to an integer number of half waves permits relatively simply active monitoring (if desired).

Figure 4:
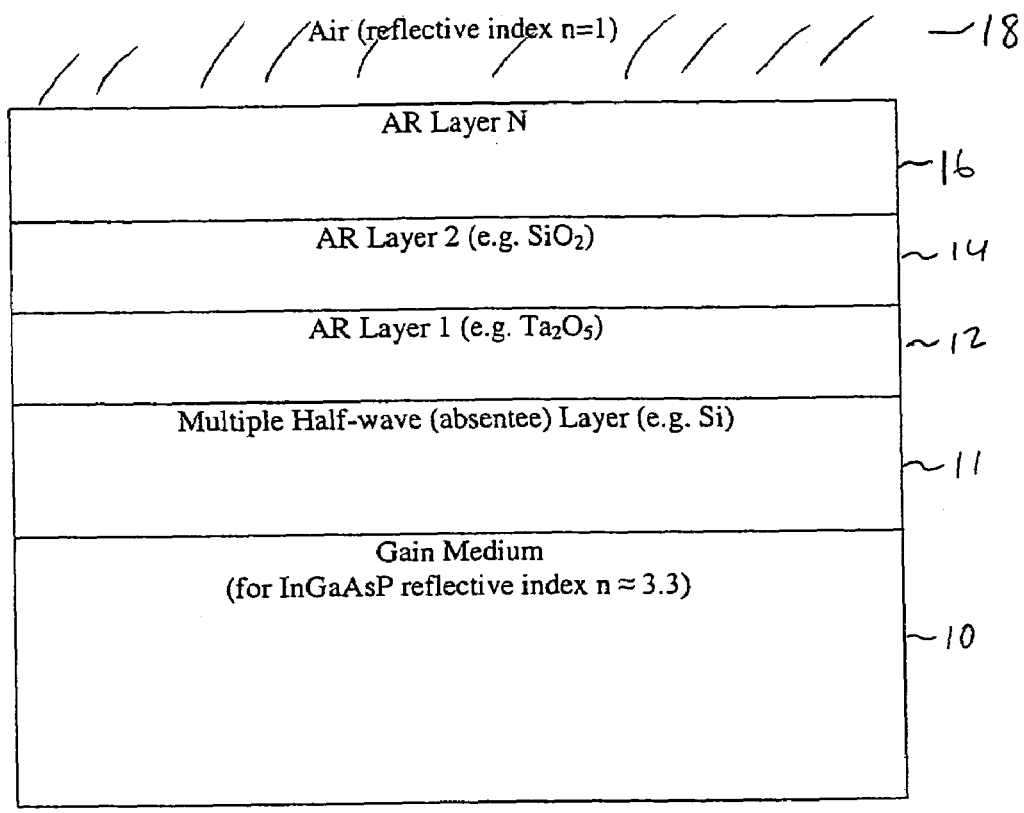
FIG. 4 is a gain medium comprising two or more AR layers to mitigate reflection as well as a multiple half wave absentee layer to complement AR layers.
Figure 5:
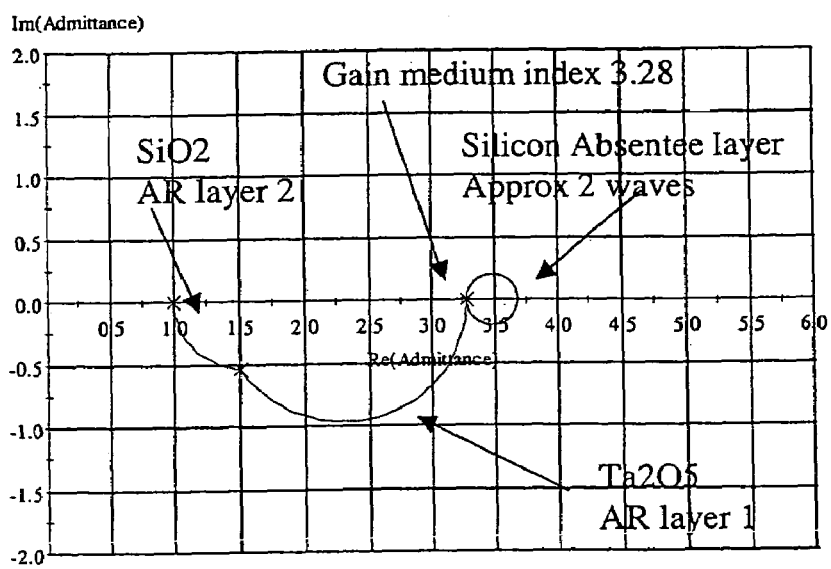
FIG. 5 is an Argand diagram showing admittance matching from the gain medium to air using multiple AR layers and the multiple half wave absentee layer as shown in FIG. 4.

FIG. 4 is a diagram showing a gain medium comprising two or more AR layers (12, 14, and 16) to mitigate reflection as well as a multiple half wave absentee layer 11 to complement the AR layers according to one embodiment of the invention. As before, the gain medium 10 may comprise InGaAsP, the first AR Layer 12 may comprise $Ta_2O_5$, and the second AR layer 16 may comprise $SiO_2$. In addition, an "absentee" layer 11, which may be for example Si, is also provided. The precise thickness of this absentee layer 11 is controlled in terms of multiple half-wave thicknesses for a designed center wavelength to be output by the gain medium 10. For example, the thickness of the absentee layer may be determined by the formula:

$$d = \frac{m\lambda}{2n}$$

Where d is the thickness of the absentee layer 11, $\lambda$ is the center wavelength to be output by the gain medium 10, n is the refractive index of the absentee layer 11, and m is the number of half-waves (i.e. number of times around the loop 30 on the Argand diagram of FIG. 5). Thus, for example, to calculate the thickness of the absentee layer to achieve each half wave (i.e. m=1) if the absentee layer is Si (n=3.5), for a center wave length to be output by the gain medium 10 of $\lambda$=1550 nm, then $$d = \frac{(1)(1550 \text{ nm})}{(2)(3.5)} \approx 221.4 \text{ nm.}$$

FIG. 5 shows an Argand diagram for the example given above where the silicon absentee layer 11 is approximately 2 half waves (or 1 full wave). In this case, m=2 and thus d=2×221.4 442 nm). In this case, note that the combination of AR layer 1, AR layer 2, and the absentee layer 11 results in a near perfect admittance match between the gain medium 10 and air 18.

Figure 6:
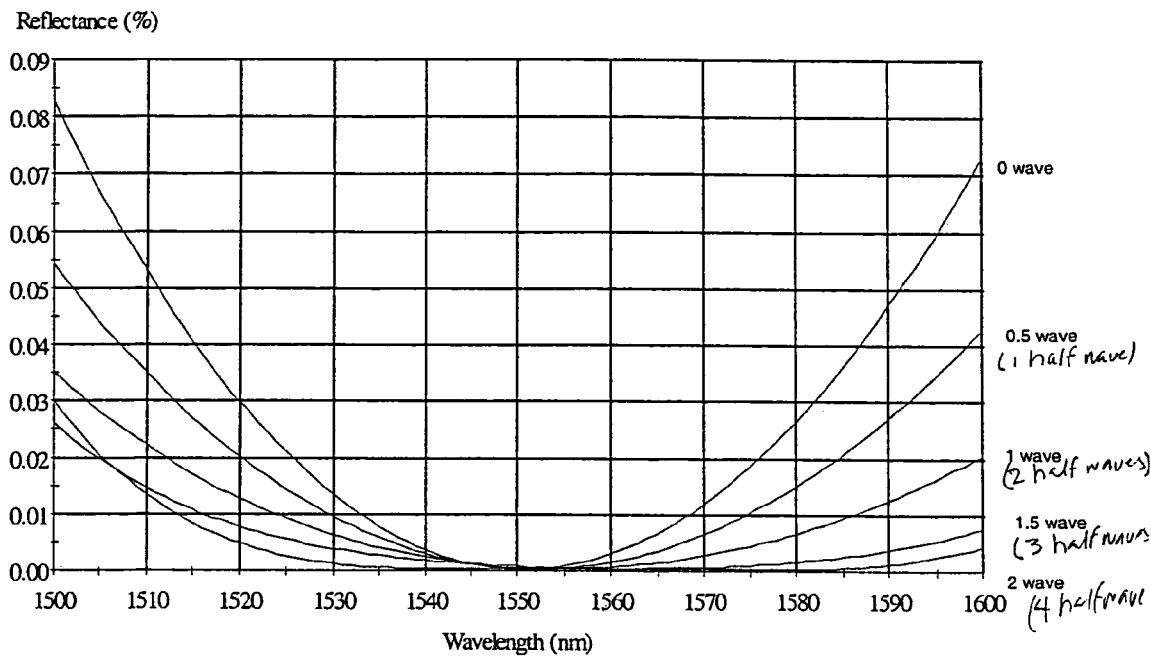
FIGS. 6 and 7 are graphs showing reflection percentage vs. wavelength for various half wave thicknesses of the absentee layer.
Figure 7:
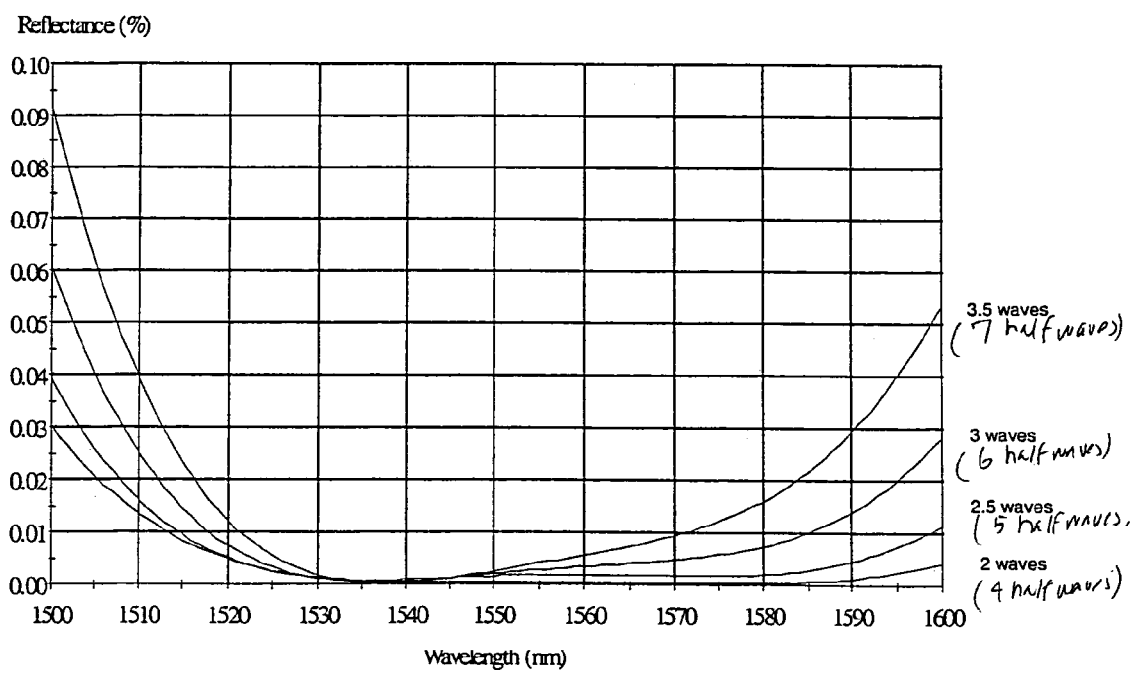

FIGS. 6 and 7 show reflectance charts for various half-wave thicknesses of the absentee layer 11 for a design center wavelength of 1550 nm. FIG. 6 shows the percentage reflectance for m=0, 0.5, 1.0, 1.5, and 2 wave thicknesses.

Likewise, FIG. 7 shows the percentage reflectance for m=2.0, 2.5, 3.0, and 3.5 wave thicknesses.

As noted above, generally the reflectance for an ECDL should be no more that about 0.01%. Referring to FIG. 6, when no absentee layer 11 is used (i.e., 0 wave) the AR coating alone tends to reduce reflection to an acceptable level for wavelengths only immediately around the designed wavelength of 1550 nm. As indicated by the 0-wave curve, for the case when no absentee layer is used the percent reflectance is only below 0.01% for wavelengths of about 1535 nm to 1568 nm. However, note that for a limited number of integer half wave thicknesses of the absentee layer 11, the absentee layer 11 compliments the AR layer(s) 12, 14, and 16, and permits the AR layer to be more effective over a broader range of wavelengths. That is, making the absentee layer successive half waves thicker as shown for the cases of 0.5, 1.0, 1.5, and 2 wave thicknesses, the performance of the AR layer is broadened over a wider range of wavelengths. In these particular examples, the greatest broadening may be shown to occur when the absentee layer is 1.5 or 2 waves thick (i.e., 3–4 half waves) where the light reflected remains at acceptable levels below 0.01% reflectance from about 1515 nm to more than 1600 nm.

FIG. 7 demonstrates that their may be a limit to the broadening benefit gained by continuing to add successive half-wave thicknesses to the absentee layer 11. In particular, by adding an additional half wave thickness greater than 2 waves, the broadening benefit begins to diminish. As demonstrated, when the absentee layer is 3.5 waves thick (i.e., 7 half-waves) much of the broadening benefit begins to be lost and the AR layer again only mitigates reflection to an acceptable degree for the wavelengths near the center wavelength of 1550.

The above embodiment has been discussed in terms of calculating the appropriate number of half-wave thicknesses of the absentee layer for a center frequency. However, in an alternate embodiment the optimum thickness of the absentee layer may be calculated over the entire range of wavelengths that the ECDL may output by using a plurality of wavelengths in the range to be the center wavelength. For example, referring to FIG. 6 or 7, if the ECDL may operate over 1510–1590 nm, then the optimal halfwave absentee layer thickness using 1510 nm as the center wavelength may be calculated, the optimal halfwave thickness for 1511 nm may be calculated and so on all that way up to the optimal halfwave thickness for 1590 nm. A computer may them average or otherwise arithmetically determine the optimum thickness of the absentee layer 11 for the entire range based on the optimum thickness calculated at a plurality of wavelengths in the range. In this manner the thickness of the absentee layer may be tweaked for optimal performance over the entire range.

While the discussion illustrated herein is specific to a particular gain media, particular AR layer(s), and particular absentee material, one skilled in the art will appreciate that embodiments of the invention are not limited to these particular materials. Indeed, for other compositions of gain media, AR layers, and absentee material, the optimum number of half-wave thicknesses of the absentee layer may be different without departing from the spirit of the inventive embodiments.

What is claimed is:

1. A laser optical coating, comprising:
at least one anti-reflective layer having an admittance between that of a gain media and an adjacent media;
wherein said gain media comprises InGaAsP;
an absentee layer having an index of refraction greater than said gain media and having a thickness corresponding to a number of half waves,
wherein the number of half waves is 1–7;
wherein said anti-reflective layer comprises:
a first layer comprising $Ta_2O_5$; a second layer comprising $SiO_2$; and said absentee layer comprises Si.

2. The optical coating as recited in claim 1 wherein a thickness of said absentee layer comprises:

$$d = \frac{m\lambda}{2n}$$

where d is the thickness of said absentee layer, $\lambda$ is a center wavelength to be output by the gain media, n is the refractive index of the absentee layer, and m is the number of half-waves.

3. The optical coating as recited in claim 1 wherein said adjacent media comprises air.

4. A method to mitigate reflection, comprising:
applying an absentee layer having a thickness corresponding to a number of half wave thickness to an optical media, said absentee layer having an index of refraction greater than that of said optical media,
wherein the number of half waves thickness is 1–7; and
applying an antireflective layer comprising at least one material having an admittance between that of said optical media and an adjacent media;
wherein optical media comprises a laser gain media comprises InGaAsP and said absentee layer comprises Si; and
wherein applying said anti-reflective layer comprises:
applying a first layer comprising $Ta_2O_5$; applying a second layer comprising $SiO_2$.

5. The method as recited in claim 4, wherein the thickness of the absentee layer comprises:

$$d = \frac{m\lambda}{2n}$$

where d is the thickness of said absentee layer, $\lambda$ is a center wavelength to be output by the gain media, n is the refractive index of the absentee layer, and m is the number of half-waves.

6. The method as recited in claim 5 further comprising:
calculating a plurality of halfwave thickness for the absentee layer by allowing a plurality of wavelengths in a range to be the center wavelength $\lambda$;
arithmetically calculating an optimal thickness for the absentee layer using said plurality of halfwave thicknesses.

7. The optical coating as recited in claim 4 wherein said adjacent media comprises air.

8. A laser comprising:
a tunable gain media to output a range of wavelengths around a center wavelength $\lambda$;
at least one anti-reflective layer having an admittance between that of said gain media and an adjacent media;
an absentee layer having an index of refraction greater than that of said gain media and, said absentee layer having a thickness d determined as: $d=m\lambda/2n$ where d is the thickness of said absentee layer, $\lambda$ is the center wavelength to be output by the gain media, n is the refractive index of the absentee layer, and m is an integer number of half-waves selected to optimize performance of said antireflective layer over said range of wavelengths,
wherein the integer number of half waves is 1–7;
wherein said gain media comprises InGaAsP;

wherein said antireflective layer comprises: a first layer comprising $Ta_2O_5$;
a second layer comprising $SiO_2$; and said absentee layer comprises Si.

9. The laser as recited in claim 8 wherein said adjacent media is air.

* * * * *